United States Patent [19]
Kean

[11] Patent Number: 5,801,547
[45] Date of Patent: Sep. 1, 1998

[54] EMBEDDED MEMORY FOR FIELD PROGRAMMABLE GATE ARRAY

[75] Inventor: Thomas A. Kean, Edinburgh, Scotland

[73] Assignee: Xilinx, Inc., San Jose, Calif.

[21] Appl. No.: 735,830

[22] Filed: Oct. 23, 1996

[30] Foreign Application Priority Data

Mar. 1, 1996 [GB] United Kingdom ............ 9604496

[51] Int. Cl.$^6$ ............................................. H03K 19/177
[52] U.S. Cl. ............................................. 326/40; 326/38
[58] Field of Search ............................ 326/38, 39, 40, 326/41, 37

[56] References Cited

U.S. PATENT DOCUMENTS

| | | | |
|---|---|---|---|
| 4,876,466 | 10/1989 | Kondou et al. | 326/38 |
| 5,343,406 | 8/1994 | Freeman et al. | 326/40 |
| 5,570,040 | 10/1996 | Ltyle et al. | 326/41 |
| 5,572,148 | 11/1996 | Lytle et al. | 326/41 |
| 5,600,597 | 2/1997 | Kean et al. | 326/38 |
| 5,705,938 | 1/1998 | Kean | 326/41 |
| 5,737,235 | 4/1998 | Kean et al. | 326/38 |

FOREIGN PATENT DOCUMENTS

WO 94/10754  5/1994  WIPO .

OTHER PUBLICATIONS

Iwanczuk, "Using the XC4000 RAM Capability." Xilinx Data Book, 1994, pp. 8–127 to 8–141.

Primary Examiner—Michael J. Tokar
Assistant Examiner—Daniel Chang
Attorney, Agent, or Firm—Edel M. Young

[57] ABSTRACT

A programmable logic device has a configuration memory which is partitioned so that it includes at least one subarray available through the programmable interconnect of the user configurable logic to be used as user memory. Subarrays of the configuration memory have independent access logic coupled with them, and coupled to the user logic array so that they may be used independently as user memories. Subarray memory access logic is provided for each subarray of memory elements, and connected to the logic cell array, and optionally to the plurality of input/output cells on the device, including a subarray decoder used for selecting addressed memory elements in the corresponding subarray in response to address signals and control signals supplied across the interconnect structures of the logic cell array, and a subarray I/O path used to provide input and output data signals between the interconnect structures of the logic cell array and addressed memory elements in the subarray. Thus, each subarray of memory elements, its corresponding subarray decoder and subarray I/O path, are independently configurable in the programmable logic device for use as user memory.

17 Claims, 6 Drawing Sheets

EMBEDDED MEMORY FOR FIELD PROGRAMMABLE GATE ARRAY

BACKGROUND OF THE INVENTION

1. Field of the Invention

The present invention relates to integrated circuits, and more particularly to field programable logic devices, such as field programmable gate arrays (FPGAs) having programble core logic, configuration memory for programming the core logic, logic for programming the configuration memory, and interfaces to external pads and pins.

2. Description of Related Art

Reprogrammable FPGAs have been available commercially for several years. The best known commercial family of FPGAs includes products of Xilinx, Inc. of San Jose, Calif. One class of these devices uses static random access memory (SRAM) cells to hold control bits which control configuration of the core logic. The SRAM cells respectively control one or more transistors at configurable points in the FPGA core logic and interconnect, or serve as one or more entries in look-up tables in the core logic. The memory cells storing control bits are collectively referred to as the configuration memory, and collectively store a configuration that determines functions the FPGA implements.

As user designs implemented by FPGAs become larger, the designs start to require blocks of read/write or read only memory. Read/write memory (also referred to as random access memory RAM) can be provided using the register resources of an FPGA, and read-only memory can be provided using logic gates in the core logic of the FPGA. However, these approaches are highly inefficient for memory areas of any size. For example, in one device there are approximately twenty-five times as many bits of device configuration memory as there are user registers available in the core logic for use as memory.

Several approaches have been taken to providing larger memory areas within a user design on an FPGA. For example, portions of the configuration memory which implement look-up tables on some FPGA devices, have been given a second read/write interface to allow them to be used as small memories within a user's design. See for example, Iwanczuk, "Using the XC4000 RAM Capability" in THE PROGRAMMABLE LOGIC DATA BOOK, Xilinx, Inc., (1994, revised April, 1995), pages 8-127 through 8-138; and Newgard, et al., "High-Speed Ram Designed in XC4000", THE PROGRAMMABLE LOGIC DATA BOOK Xilinx, Inc., (1994, revised April, 1995), pages 8-139 through 8-141. This provides a relatively large number of relatively small, independently accessible memories. However, it is difficult to cascade several of these smaller memories into a larger unit. Also the techniques used for the look-up table memory are not applicable to some FPGA architectures, such as cellular designs which have small two or three input functional units instead of the larger look-up table implementations which rely on four or five inputs. In addition, most of the configuration memory cells are not look up table entries but control resources of various kinds, and are not available for use according to this technique.

An alternative approach in the prior art is based on providing separate, dedicated areas of random access memory (RAM) on the integrated circuit with the programmable logic device. These separate dedicated RAMs do not control FPGA resources. Thus dedicated RAMs can be dense, and consume relatively small amounts of area on the chip. However, the dedicated RAM is an inflexible resource located at a fixed position on the chip chosen by the designer of the FPGA. So if a design does not require RAM memory, the fixed RAM is unused. If the design requires more RAM than the fixed resources supply, the design will not map onto the part. Fixed RAM areas also reduce the placement options available to place and route software which is used to configure the FPGAs.

An alternative approach is provided using the structures of my prior filed U.K. Patent Application entitled PROGRAMMABLE SWITCH FOR FPGA INPUT/OUTPUT SIGNALS, filed May 2, 1995 having application no. 9508931.4 (U.S. patent application Ser. No. 08/465,134 filed Sep. 5, 1995). According to this technology, access can be given to the configuration memory through a programmable switch near the external pads on the chip. The programmable switch receives user logic signals available at the edge of the device, memory control signals, and memory data path signals, and is able to selectively route those signals according to a user configuration of the programmable switch. In this case, a single, potentially large memory is available to the user. One drawback of this approach is that only a single memory operation can be active at a given time. Some applications require several independent memories.

In present FPGAs having addressable configuration RAM, some of the pins of the FPGA are dedicated to address lines, data lines, and other control lines for loading the configuration memory, while other pins are dedicated to input and output of user logic. FIG. 1 shows such an FPGA chip and the relationships between external pads, the FPGA user logic structures, and the configuration memory which configures the user logic. It is convenient to visualize the FPGA as formed in first and second stories, a first story holding the configuration information which selects the functions performed by the FPGA, and a second story performing the function selected by the user. FIG. 1 illustrates the FPGA in this manner. (Physically, the configuration memory and the user logic are formed on the same substrate of an integrated circuit structure. One such structure is described in PCT Application No. WO 94/10754 published 11 May 1994.)

As shown in FIG. 1, some of the pads are for accessing user logic 19 and others are for addressing and loading configuration memory 25. The pad drivers 18 are configured by a user-generated enable signal to determine whether a particular user logic pad 16 is an input pad, an output pad, or unused. Switches such as switch 15 are configured by the underlying configuration memory 25 to transfer signals between the pad drivers 18 and the internal user logic 19. Such internal user logic is discussed in detail in above referenced Patent Cooperation Treaty patent application Serial No. WO 94/10754. Pads R0 through R3, R/W, CE, CK, RST, C0 through C2, D0 through D7 and their related pins (not shown in FIG. 1) are dedicated to the configuration function. A commercially available device typically has more pads for both configuration and user logic than shown in FIG. 1.

Configuration memory 25 is loaded by addressing a memory cell or memory word as is done in a conventional RAM. Row and column address busses 22 and 27 carry address signals which are decoded by row and column decoders 21 and 26, and connect a selected row of configuration memory 25 to configuration data bus 23 to be read or written. Pads D0 to D7 are coupled to configuration data bus 23.

A memory control unit 24 enables row and column decoders 21 and 26 in response to well known clock, chip enable, and reset signals from pads CE, CK and RST, respectively. Memory control unit 24, in response to a read/write signal on pad R/W, determines whether pads D0 through D7 will transfer an input configuration for writing or an output configuration for reading across data bus 23.

If the structure of FIG. 1 is to be reconfigured or partially reconfigured during operation, an external device such as a microprocessor addresses portions of the configuration memory and loads new data into those locations.

As described in my prior filed application entitled "PROGRAMMABLE SWITCH FOR FPGA INPUT/OUTPUT SIGNALS" (referred to above), the configuration memory can be utilized as user RAM or ROM relying on the decode control logic and data input/output paths available for writing and reading to the configuration memory.

One primary design goal for FPGAs is flexibility. Thus, it is desirable to provide a user of an FPGA as many options in the utilization of the available resources as possible. One resource which is utilized very often in logic design is memory. Therefore, it is desirable to provide improved flexibility in the utilization of memory resources on FPGAs and other programmable logic devices.

SUMMARY OF THE INVENTION

The present invention provides a programmable logic device having a configuration memory, which is partitioned so that it includes at least one subarray available through the user configurable logic to be used as memory in the user's design. According to the present invention, the configuration memory is accessible using global configuration memory access logic normally used for loading configuration programs into the programmable logic device. In addition, subarrays of the configuration memory have independent access logic coupled with them, and coupled to the user logic array so that they may be used independently as user memory.

The present invention can be characterized as a programmable logic device that comprises a plurality of input/output cells, a configurable logic array of configurable logic cells and interconnect structures, and a memory array of memory elements, preferably SRAM cells, coupled with the logic cell array. The memory array acts as a configuration memory to store data to program the configurable logic cells and configurable interconnect points in the configurable logic array. The memory array includes one or more subarrays of addressable memory elements. Each subarray of addressable memory elements has a corresponding subarray of configurable logic cells in the configuration memory. Subarray memory access logic is provided for each subarray of memory elements, and connected to the configurable logic array, and optionally to the plurality of input/output cells on the device. Each subarray includes a subarray decoder coupled to the configurable logic array, used for selecting addressed memory elements in the corresponding subarray in response to address signals and control signals supplied across the interconnect structures of the logic cell array. Also, the memory access logic for the subarrays includes a subarray I/O path coupled to the configurable logic array. The subarray I/O path provides input and output data signals between the interconnect structures of the logic cell array and addressed memory elements in the subarray. Thus, the subarrays of memory elements, with the corresponding subarray decoders and subarray I/O paths, are independently configurable in the programmable logic device for use as user memory. When used as user memory, the subarray of configurable logic cells in the configurable logic array corresponding to the subarray of memory elements used as user memory is unused for logic functions. Thus, in a programmable logic device, such as a field programmable gate array (FPGA), a user logic function may be defined over for example two-thirds of the chip, while the remaining portion of the chip is used for user memory. The structures provided by the present invention allow for flexible utilization of the configuration memory resources in an FPGA or other field programmable logic device, unavailable in the prior art.

The present invention can also be characterized as a programmable logic device having an SRAM based configuration memory, and global memory access logic coupled with the configuration memory. The global memory access logic is utilized for reading and writing programs for configuration of the programmable logic device. One of the configuration options available according to the present invention is to segment the configuration memory, such that subarrays are utilized as user memory. Thus, the programmable logic device of the present invention includes a plurality of subarrays of SRAM memory elements within the configuration memory. A plurality of subarray decoders with corresponding configurable interconnect circuits coupled to the configurable logic array are associated with corresponding subarrays of the configuration memory. Also a plurality of subarray I/O path circuits are associated with corresponding subarrays in the configuration memory. Configurable interconnect circuits are coupled with corresponding subarray decoders. These interconnect circuits include a programmable switch including inputs connected to the configurable logic array, and including both outputs connected to the configurable logic array and outputs connected to the subarray decoder for the corresponding subarray. Also, configurable interconnect circuits for corresponding subarray I/O paths are included. These configurable interconnect circuits include a programmable switch having inputs connected to the configurable logic array, and inputs connected to the subarray I/O path for the corresponding subarray. The outputs of a programmable switch associated with a subarray I/O path circuit include outputs connected to configurable logic array, and outputs connected to the subarray I/O path circuit for the corresponding subarray. Using these configurable interconnect circuits, a subarray of the configuration memory can be connected for use as user memory, used as normal configuration memory specifying the logic functions of the corresponding subarray of the configurable logic array or, with careful layout, used in part)for memory and in part for logic configuration. To use a subarray for both logic configuration and memory, the design must ensure that the subset of the subarray accessed for memory locations does not overlap the subset used for configuring routing and logic resources.

According to the present invention, the subarrays of the configurable logic array to which members of the set of subarrays of the configuration memory correspond, include in one configuration 256 configurable logic cells arranged for example in 16×16 cell arrays. Also, the set of subarrays in a programmable logic device according to one configuration of the present invention includes for example 16 cells arranged preferably in a 4×4 layout.

The present invention is particularly suited to FPGA type programmable logic devices with SRAM based configuration memory. The partitioning of the configuration memory into subarrays, and the providing of independent memory access logic for each subarray, provides a user the ability to set up memories in the programmable logic device near the logic resources which require the memory. Also, use of the interconnect structure in the logic cell array for routing data and addresses to the memory subarrays allows flexibility in the placement and routing of logic on the device, because signals can "fly over" the memory subarray used as user memory to allow flexible interconnection of the surrounding logic. This way, the subarrays can be positioned throughout the device as suits the needs of a particular implementation.

Other aspects and advantages of the present invention can be seen upon review of the figures, the detailed description and the claims which follow.

DETAILED DESCRIPTION

The detailed description of a preferred embodiment of the invention is illustrated with respect to FIGS. 2 through 6.

Figure 1:
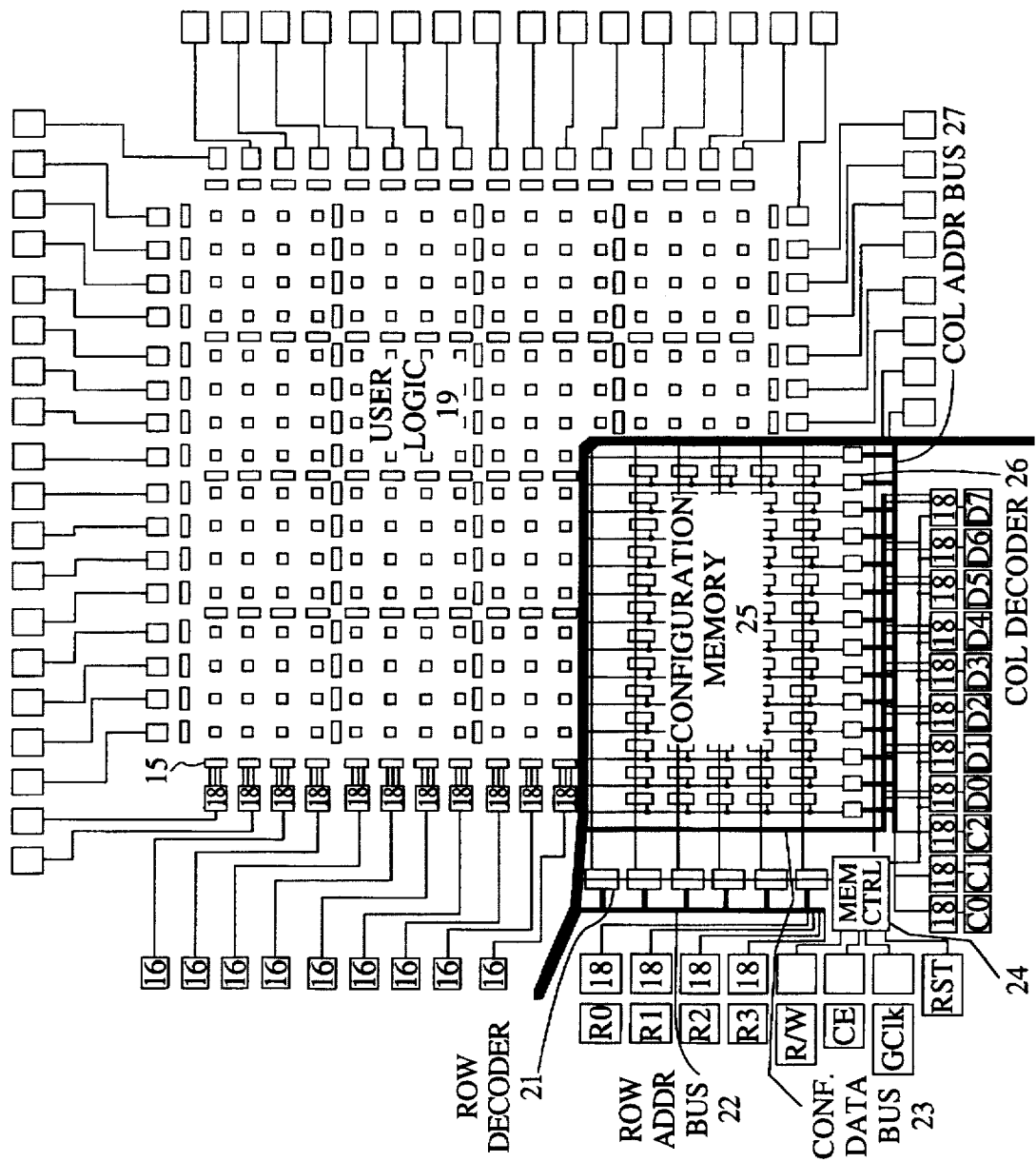
FIG. 1 shows an FPGA chip and the relationships among external pads, the FPGA user logic structures and the configuration memory according to the prior art.
Figure 2:
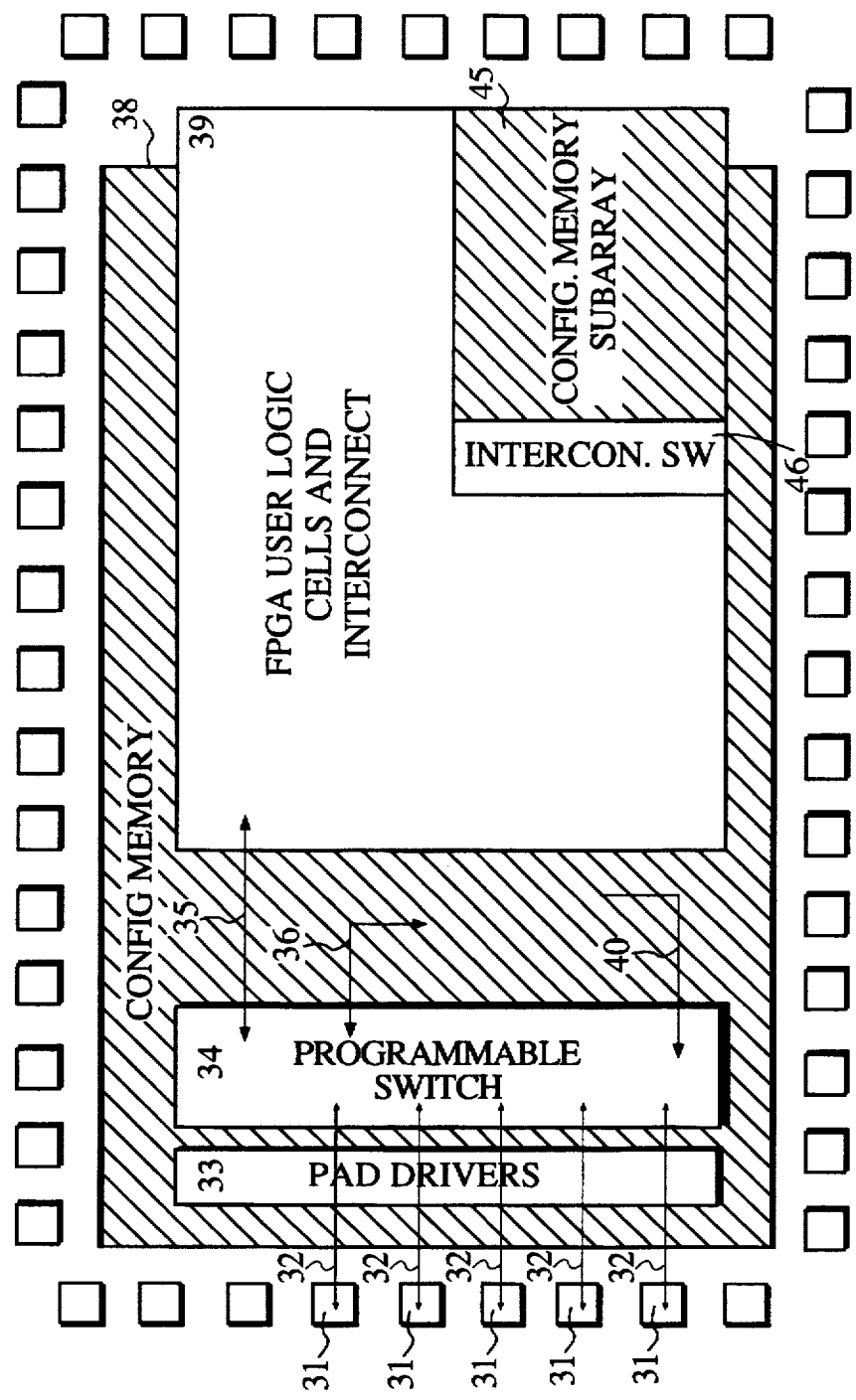
FIG. 2 shows a structural relationship between a pad, a pad driver, a portion of FPGA core logic, and the FPGA configuration memory, showing a configuration memory subarray according to the present invention.

FIG. 2 shows on structural relationship between pads 31, a programmable switch 34, the FPGA user configurable logic 39 (including interconnect resources not shown), and the configuration memory 38, according to the invention. Programmable switch 34 can access both the configuration memory 38 and the user logic 39. Programmable switch 34 can send and receive data to and from user logic 39 as indicated by the bidirectional bus 35 and can also send and receive data from configuration memory 38 as indicated by bidirectional bus 36. FIG. 2 illustrates that the underlying configuration memory 38 controls the pad drivers 33, the programmable switch 34 and the user logic 39. The configuration memory 38 also controls programmable interconnect points in the interconnect structure within the user logic of the FPGA (not shown in this diagram). The pads 31 and pad drivers 33 connect to programmable switch 34. Connections which programmable switch 34 can make include:

1. apply an input signal from a pad 31 to a line of bus 35 to the FPGA user logic 39, thereby allowing a user to apply an input signal to the FPGA user logic;
2. apply an input signal from a pad 31 to a line of bus 36 as a control line (address, data, chip enable, read/write, clock etc. depending up on which pad is used) to configuration memory 38, thereby allowing external signals to change the configuration of user logic 39;
3. apply an input signal from a pad 31 to a line of bus 36 as control line (address, data, chip, enable, read/write, etc.) to configuration memory 38, thereby allowing external signals to change the configuration of the programable switch itself;
4. take a user logic output signal applied to a line of bus 35 and apply it through one of pad drivers to 33 a pad 31 thereby providing a chip output signal;
5. read a value in configuration memory 38 onto a line of bus 36 and then apply it to an input terminal in FPGA user logic 39 via bus 35;
6. read a value in configuration memory 38 onto a line of bus 36 and apply it on a line 32 to a pad 31.
7. connect internal signal lines (word, bit) 40 which control configuration memory 38 through bus 35 to user logic 39;
8. take a user logic output signal applied to a line of bus 35 and apply it as one of several control signals for writing to a memory location in configuration memory 38, whereby user logic 39 changes the FPGA configuration;
9. perform a two-step process of applying an external signal via bus 35 user logic 39, which applies a logic function of this signal to another line of bus 35, and use the output of this logic function to control configuration memory 38; and
10. apply an output signal from the configuration memory 38 via bus 36 to user logic 39, which modifies the signal, then apply the modified signal taken from bus 36 through a pad driver 33 to an output pad 31.

The above list is not exhaustive. Many other options are offered to an FPGA user by the novel switch 34.

Also shown in FIG. 2 schematically is a configuration memory subarray 45 having independent memory access logic coupled with a programmable interconnect switch 46 on the device. The configuration memory subarray 45 is shown in the same plane as the user logic 39 in this example, because when this subarray 45 is configured as memory, the user logic associated with the configuration memory subarray 45 is not used. Also, the interconnect switch 46 is used for connecting memory access logic of subarray 45 to the FPGA user logic structures 39.

FIG. 2 shows a single subarray configured with memory access logic independent of the main memory access logic for the configuration memory. In a preferred system, a larger number of configuration memory subarrays are set up within the device, as described with respect to the example shown in FIGS. 3-6.

Figure 3:
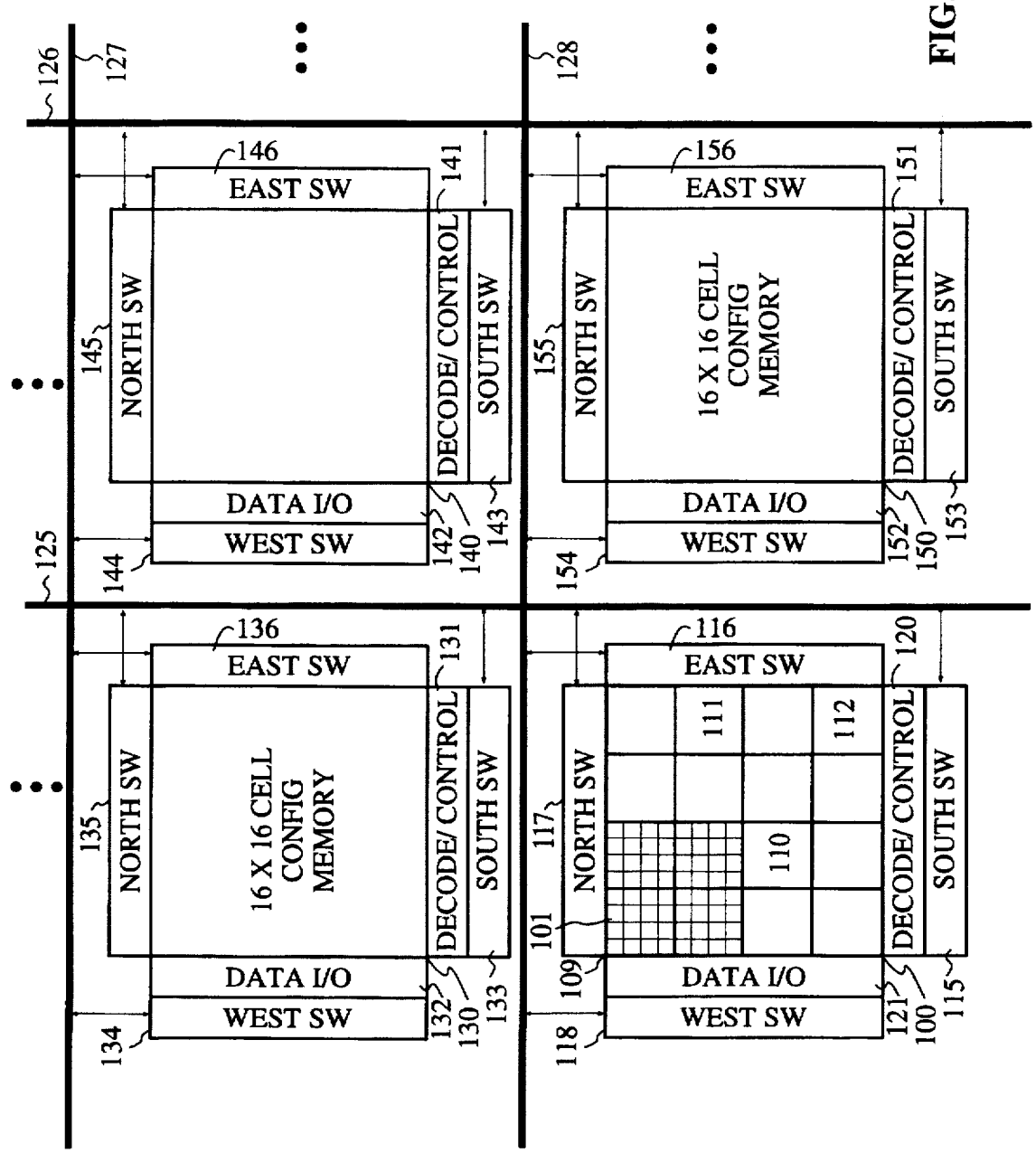
FIG. 3 illustrates the layout of one example FPGA architecture in which the configuration memory is partitioned into a plurality of subarrays according to the present invention.

FIG. 3 shows the layout of an FPGA device including resources to partition the configuration memory into a plurality of subarrays that are independently accessible. FIG. 3 shows a subset of a larger device, including configuration memory subarrays for corresponding 16×16 logic cell blocks on the device. Thus, a first subarray 100 provides a configuration memory for a 16×16 logic cell block. Sixteen logic cells (e.g. cell 101) form a 4×4 unit 109 of cells. Twelve other 4×4 units (e.g. 4×4 units 110, 111, 112), are illustrated within the subarray 100. Each cell within a 4×4 block is able to drive output signals to, and receive input signals from, its nearest neighbors to the north, south, east and west in the layout. In addition, cells at the 4×4 block boundaries are able to drive their outputs onto length-four flyovers in the programmable interconnect. Special switch units are provided around each 4×4 block boundary to facilitate these connections. These switches are not shown in this example for clarity. In addition to routing signals to their nearest neighbors, each cell includes an output that is routed to other destinations, such as to switches at the boundaries of the 4×4 unit in which the cell is found. The configuration memory controls the switches on the boundaries for the purpose of routing signals among the interconnect structure and the user logic cells.

In addition, boundary switches at 16×16 cell block boundaries include additional inputs and outputs, as will be described with reference to FIGS. 5 and 6. Thus, on each subarray such as subarray 100, a length 16 switch 115 is located on the south, a length 16 switch 116 is located on the east, a length 16 switch 117 is located on the north, and a length 16 switch 118 is located on the west. According to the present invention, memory access logic is included with the subarray 100. Thus address decode and control logic 120 is coupled with the switch 115 on the south boundary and data input/output (I/O) path circuits 121 are coupled with the switch 118 on the west boundary in this example.

The programmable interconnect structure on the device is represented in FIG. 3 by buses 125 and 126 which run north and south on the device, and buses 127 and 128 which run east and west on the device. West switch 118 associated with the subarray 100 supplies signals to the bus 128 which runs east and west. North switch 117 is coupled with bus 125 which runs north and south. East switch 116 is coupled with bus 128 which runs east and west. South switch 115 is coupled with bus 125 which runs north and south.

The interconnect structure represented by the buses 125–128 includes lines of various lengths as known in the art. Thus, certain lines on the interconnect structure are the length of four logic cells. Other lines are the length of 16 logic cells, other lines are the length of 64 logic cells, and other lines may extend globally across an entire chip.

In addition to the subarray 100, a plurality of other subarrays are provided on the chip having similar structure. Thus, subarray 130 includes decode and control logic 131, and data I/O path circuits 132. A switch 133 is located on the south boundary of the subarray 130 and coupled with decode and control logic 131. A switch 134 is located on the west boundary of subarray 130 and coupled with data I/O path circuits 132. Switch 135 is located on north boundary of the subarray 130 and switch 136 is located on the east boundary.

Subarray 140 includes decode and control logic 141 and data I/O path circuits 142. Switch 143 is coupled with the decode and control logic 141 on the south. Switch 144 is coupled with the data I/O path circuits 142 on the west side of the subarray 140. Switch 145 is coupled with the subarray 140 on the north side and switch 146 is coupled with the subarray 140 on the east boundary.

Subarray 150 includes decode and control logic 151 and data I/O path circuits 152. Switch 153 is coupled with the decode and control logic 151 on the south boundary. Switch 154 is coupled with the data I/O path circuits 152 on the west boundary. Switch 155 is coupled with the subarray 150 on the north boundary and switch 156 is coupled with the subarray 150 on the east boundary. The pattern of subarrays in FIG. 3 is repeated across the integrated circuit in a preferred system so that any 16×16 block of logic cells may be configured to use the corresponding configuration memory subarray as random access memory, rather than to control logic functions within the 16×16 block. The programmable interconnect is utilized for distributing data, address and control signals either from the user logic in other segments of the device or from the I/O pads for the purposes of accessing the subarrays which are configured to be used as RAM.

Figure 4:
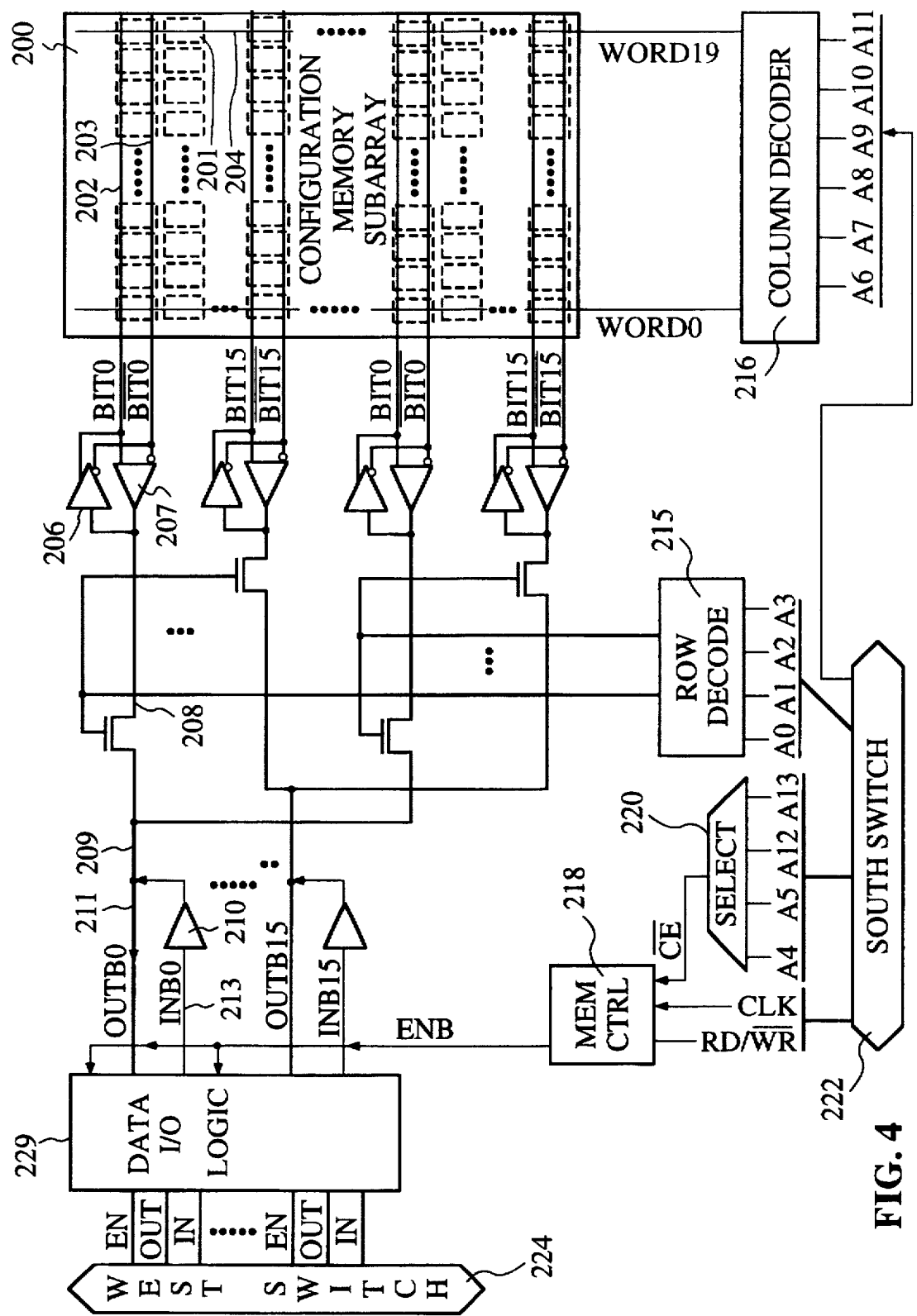
FIG. 4 is a diagram showing the memory access logic for a subarray of the configuration memory, according to the present invention.

FIG. 4 provides a more detailed diagram of the resources used with each subarray of a configuration memory according the architecture of FIG. 3. The configuration subarray 200 of FIG. 4 is associated with a 16×16 block of cells as illustrated in FIG. 3. Thus the subarray 200 includes a set of memory elements such as element 201. Members of the set of elements are arranged in rows and columns. The rows are coupled to bit lines, which in the standard SRAM architecture include true and complement bit lines 202 and 203 for each row. Also, each column, according to the layout of FIG. 4, is coupled to a word line 204. For each row, a data in driver 206 and a sense amp 207 are provided along the two complementary bit lines 202 and 203. The sense amp 207 and data-in driver 206 are coupled to routing logic which includes row select transistors, such as transistor 208, which are used bidirectionally. In a preferred system, the bidirectional line 209 is coupled to a structure for providing unidirectional input and output lines to the interconnect structure. Thus, an input buffer 210 and a output line 211 are coupled with line 209. The output line 211 is coupled with data I/O circuits 229, which in turn are connected to the west side switch 224 according to the embodiment shown. Also the input line 213 which drives buffer 210 is supplied from the west side switch 224 for the 16×16 block. Optionally, the enable signals EN generated by memory control logic 218 are also supplied to the switch 224.

The row select lines for each access to the subarray 200 are controlled by a row decoder 215. The inputs to the row decoder 215 include address bits A0 through A3. A column decoder 216 drives the word lines for the subarray 200. The inputs to the column decoder 216 include address bits A6–A11 in the embodiment described. A memory control block 218 is included with the memory access logic for the subarray 200. The memory control block 218 receives a read/write signal, and a clock signal for the purposed of controlling the timing of the accesses and other operations as known in the art. A chip enable input to the controller 218 is controlled by a decoder 220, used to select an independent subarray on the device. According to the embodiment illustrated, the decoder 220 is controlled by address bits A4, A5, A12 and A13 to select one of 16 subarrays on the device.

According to the present invention, the address and control signals are supplied to the memory access logic from the switch 222 on the south boundary subarray 200. The data I/O path circuits are provided through the switch 224 on the west side of the subarray 200. Using the structure shown in FIGS. 3 and 4, the subarray 200 can be configured by setting the switches 222 and 224 so that the subarray 200 is dedicated for access through external signals (as normal configuration memory) or as local memory for use within user designs.

Figure 5:
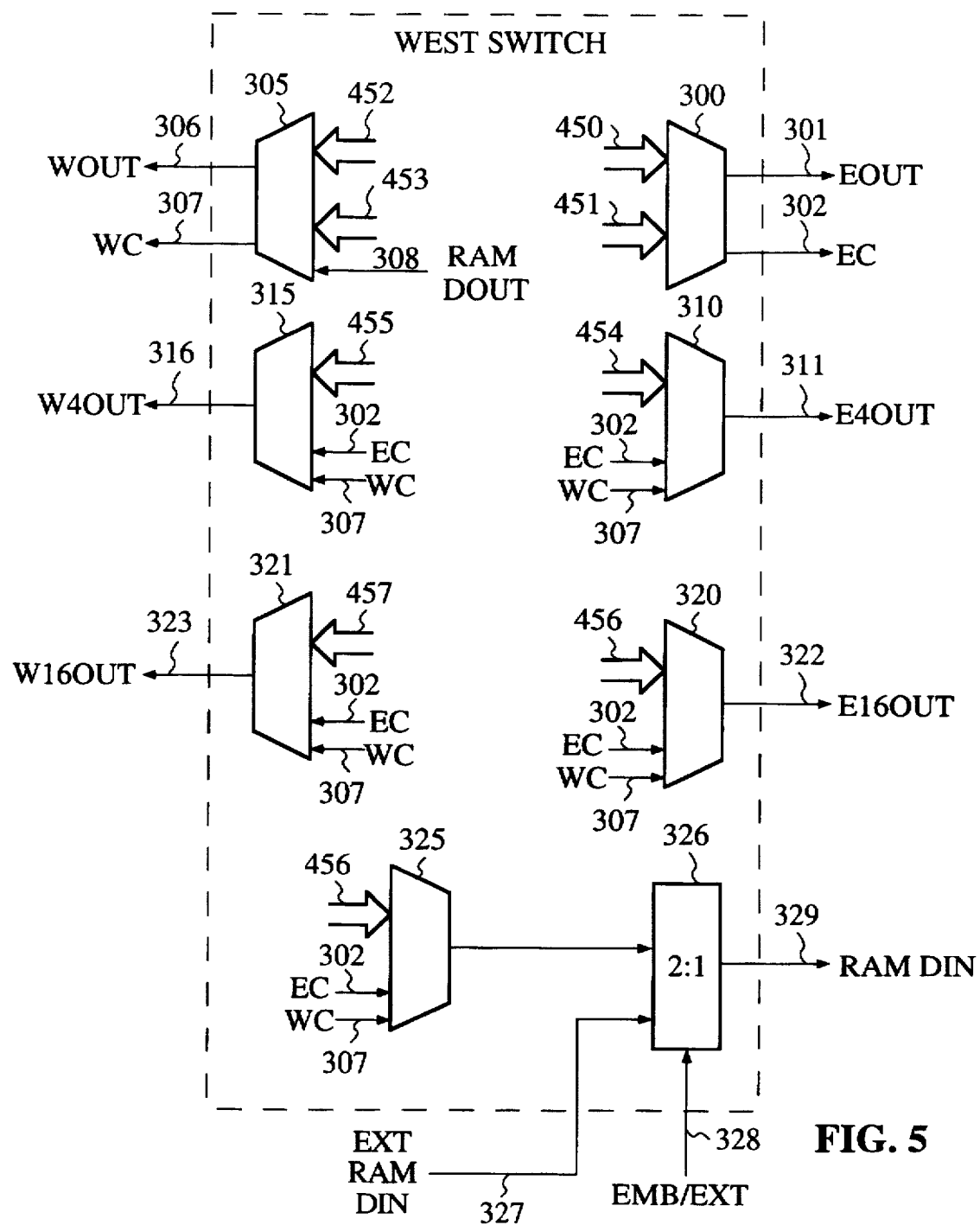
FIG. 5 illustrates the structure of a west side switch used in the architecture of FIGS. 3 and 4.
Figure 6:
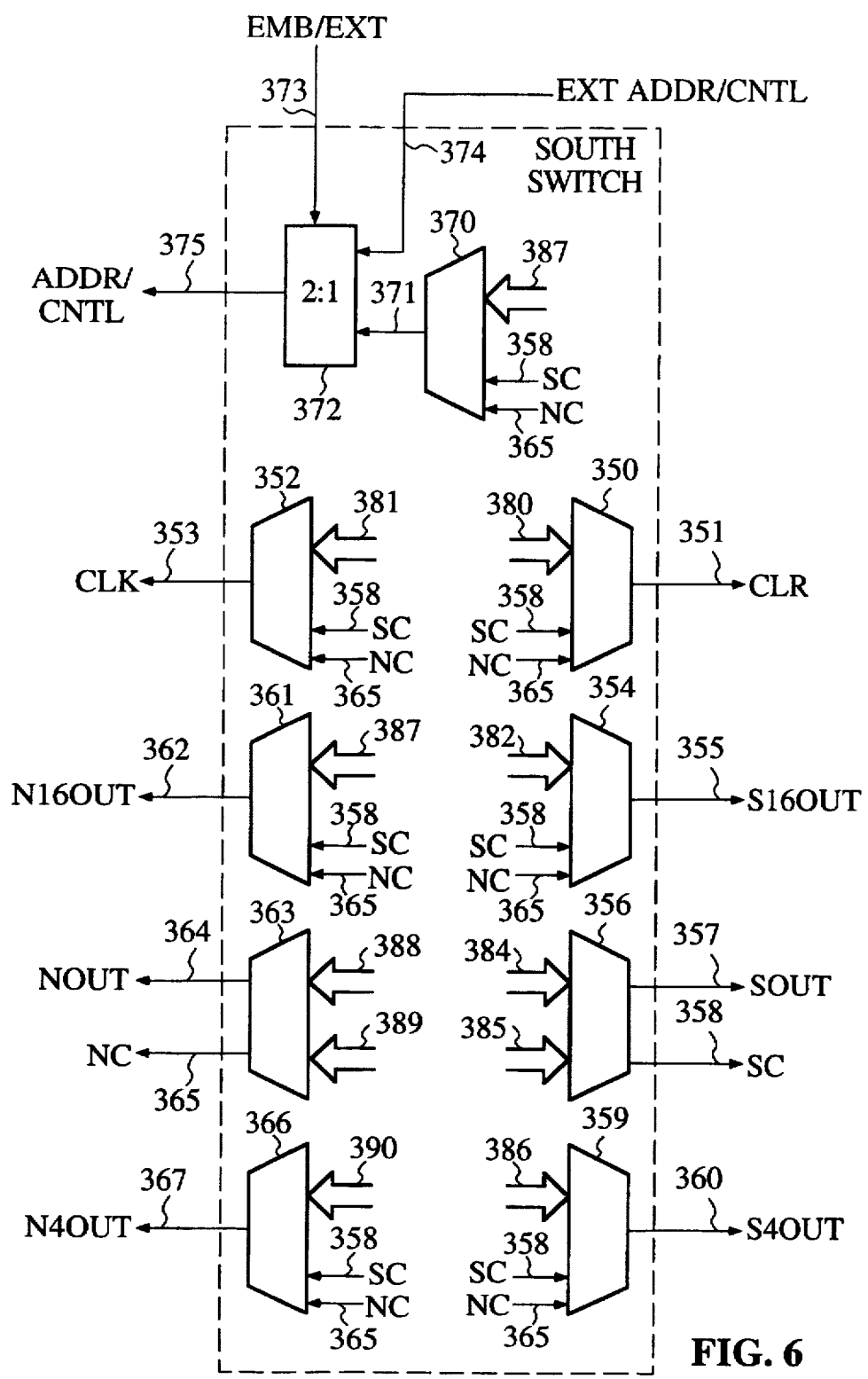
FIG. 6 illustrates the structure of a south side switch used in the architecture of FIGS. 3 and 4.

FIG. 5 illustrates the structure of the west side switch used for data input/output path according to a preferred embodiment of the present invention; and FIG. 6 illustrates the structure of the south side switch used for the address and control paths in a preferred embodiment of the present invention. With reference to FIG. 5, the west side switch includes a first selector 300 which generates the signal EOUT on line 301 connectable to an adjacent cell on the east side. The inputs to the selector 300 include a set of signals available from the user logic structures including a first subset 450 and a second subset 451. An additional output EC on line 302 is selected from the second subset of the set of signals supplied as input to the selector 300. If EOUT on line 301 is configured to be one of second subset 451 used for providing the output EC, then EOUT on line 302 and EC on line 302 are identical. If EOUT is configured to be a signal within the first subset 450, then EOUT on line 301 and EC on line 302 are different.

In the preferred embodiment, the set of signals (subsets 450, 451) supplied as input to the selector 300, includes input signals from the interconnect structure (length four and length sixteen flyovers) and input signals from the logic cells adjacent the switch.

The switch also includes selector 305 which generates the output signals WOUT on line 306 connectable to a cell on the west side, and WC on line 307. In a manner similar to selector 300, the set of input signals to selector 305 includes a first subset 452 and a second subset 453. Output signal WOUT is selected from a union of the first subset 452, the second subset 453 and RAM data out on line 308 (corresponding to a signal labeled "OUT" in FIG. 4). The output signal WC is selected from a union of the second subset 452 of the input signals and the RAM data out on line 308.

The switch includes selector 310 which generates the output E4OUT on line 311 connectable to a length four flyover. Selector 310 includes a set 454 of inputs from the interconnect structure and adjacent logic cells. In addition, the EC signal on line 302 and the WC signal on line 307 are supplied as inputs to the selector 310. Selector 315 in the switch is used for generating the output signal W4OUT on line 316 connectable to a length four flyover. The inputs to selector 315 include a set 455 of signals selected from the interconnect structure and adjacent logic cells. In addition, the input signals to selector 315 include the WC signal on line 307 and the EC signal on line 302. Selector 320 and selector 321 generate the E16OUT signal on line 322 and the W16OUT signal on line 323, respectively, connectable to length sixteen flyovers. Inputs to the selectors 320 and 321 include respective sets 456, 457 of signals selected from the interconnect structure and from logic cells in the array adjacent to the switch. Also, the EC signal on line 302 and the WC signal on line 307 are available as inputs to the selectors 320 and 321.

Selector 325 is included in the switch as well. Selector 325 receives as input signals the set 456 of signals from the interconnect structure and adjacent cells, and receives the EC signal on line 302 and the WC signal on line 307 as inputs (same as selector 320). The output of selector 325 is supplied to a 2 to 1 selector 326. Note that even though selectors 320 and 325 have the same input signals, they may be controlled to output different ones of their input signals. The other input to the selector 326 is external RAM data on line 327 used for global configuration memory functions. Selector 326 is controlled by the embedded/external configuration signal on line 328. The output of selector 326 supplies the RAM data on line 329 (corresponding to a signal labelled "IN" in FIG. 4). When the embedded memory is not enabled, external data from line 327 is presented to the subarray. When the embedded memory is enabled, the selector 325 supplies data from the user logic as the RAM data in.

There are 16 of the switches shown in FIG. 5 along the west edge of a 16×16 tile in order to supply 16 bits of output data to the interconnect, and 16 bits of input data to the subarray.

FIG. 6 shows the structure of a switch on the south boundary of the 16×16 tile according to the architecture of FIGS. 3 and 4. The south boundary switch includes selector 350 for supplying a clear signal CLR on line 351. The selector 350 receives a set 380 of signals as input including global clear signals, signals from the interconnect structure, global clock signals, signals from adjacent logic cells, and the like. Selector 352 supplies a clock signal CLK on line 353. The inputs to the selector 352 include a set 381, including global clock signals, global clear signals, signals from adjacent logic cells, signals from the interconnect structure and the like. Selector 354 is used for generating an S16OUT signal on line 355 connectable to a length sixteen flyover. Selector 356 is used for generating an signal SOUT on line 357 connectable to an adjacent cell, and an SC signal on line 358. Selector 359 is used for generating an S4OUT signal on line 360 connectable to a length four flyover. Selector 361 generates signal N16OUT on line 362 for a length sixteen flyover. Selector 363 generates an NOUT signal on line 364 for connection to an adjacent cell, and an NC signal on line 365. Selector 366 generates an N4OUT signal on line 367 for connection to a length four flyover. As with the switch on the west boundary described with reference to FIG. 5, the inputs to the selectors 354, 356, 359, 361, 363 and 366 include respective sets of signals (382, 383, 384, 385, 386, 387, 388, 389, 390) from the interconnect structure, from adjacent logic cells, and the like. Also, the NC signal on line 365 and SC on line 358 are supplied as selectable input signals for multiplexers 354, 361, 359 and 366.

The south switch of FIG. 6 also includes multiplexer 370 having the same input signals on lines 387, 358, 365 in a preferred embodiment as the multiplexer 361. The multiplexer 370 supplies a RAM address bit or control signal on line 371. Line 371 is supplied to a selector 372 which is configured by the embedded or external control signal EMB/EXT on line 373. The other input to selector to 372 is an external RAM address and control signal on line 374. The output of selector 372 is an address or control bit on line 375 used by the address decoder or memory control logic for the associated subarray.

There are sixteen of the switches shown in FIG. 6 along the bottom of a 16×16 cell block. According to the embodiment of FIG. 4, 14 signals are used as address signals and 2 signals are used for the read/write signal and the clock signal for the associate subarray.

In a preferred embodiment, the clock signal is provided by the external clock GCLK provided to the FPGA device. It is possible to connect the clock signal to the RAM by the switch illustrated in FIG. 6 from a variety of sources. However, this brings complex timing problems when the memory is to be accessible either through the external interface or as embedded memory.

The address bus is composed of row address and column address lines. The number of bits of row address depends on the width of data in and data out buses. Preferably this is selectable between eight and sixteen bits, allowing either an 8×512 or 16×256 memory for each subarray. This implies that the row address must have three or four bits and the column address six or five bits for a total bus width of nine bits when the memory is used as an embedded memory. Four additional address bits are used to select a particular subarray.

The embedded/external signal can be generated either from user logic, such as an unused address/control signal on the south switch adjacent to RAM subarray, from a bit of configuration memory, or from logic in the external RAM interface. Preferably it is generated from logic in the external RAM interface decoding an external access to the particular subarray. That is, each subarray of embedded RAM will have a distinct embedded/external signal. This means the external resource can always reconfigure the RAM to change the function of the FPGA, while blocking user logic transfers to the RAM only when necessary.

Normally, not all of the configuration memory is accessible to user configurable logic by the structure of the present invention. For example, in a preferred system only two out of the three bytes of configuration memory normally used for a logic cell are made available, and the memory associated with the switches on the 4×4 and 16×16 cell boundaries is also hidden. This implies that the address bus provided to the user logic is a subset of that provided to the external programming interface. By selectively making areas of the memory inaccessible from the user logic, the device can ensure that no matter what values the user stores in the accessible subarray which will be setting the state of programmable routing multiplexers, no configurations can be entered which might damage the device or have high power consumption. Leaving the configuration memory for longer routing resources out of the user accessible areas allows these wires to be used to route user signals "over" the portions of the device which are configured as user RAM. Without this feature, the user RAM areas would present dead zones through which wires could not be routed, making it hard to access logic on the other side of the user RAM areas, and hence making designs less routable.

A concern in the design of the embedded memory of the present invention, is that the number of wires required by the embedded addresses, data, and control to the subarray match up well with a number neighboring of user routing resources available in the array. Thus, availability of resources must be taken into account to make sure that the address and data busses can be connected using the interconnect structure of the device, and that routing congestion is avoided within the user design when a subarray of the configuration memory is partitioned for this purpose. Another concern in the design is that the layout of the memory access logic data input/ output logic and of the address and control logic, associated with the subarray should not unduly increase the pitch of a set of programmable cells associated with the subarray, and thereby create unacceptable area overhead in the layout of the chip. The size of the data I/O logic 121 is influenced to a large extent by the width of the external data bus it provides, memory with an eight bit data bus having smaller word logic than one with a 32 bit bus.

According to the structure shown in FIG. 3, 4×4 cell units could be selected to define a subarray. However, this small subarray may be found to have a poor balance of address and data signals to user connections in some designs. Also, 64×64 cell subarrays could be utilized. However, this limits the number of available subarrays on the device which can be independently operated. The size of the subarrays is influenced to a large extent by the device routing architecture and process technology. Therefore, 16×16 cell units are not necessarily optimal for all designs.

The preferred architecture shown in FIGS. 3 and 4, having a 16 bit data input/output bus and 16 bit address and control bus are readily implemented using the 16×16 configuration.

Accordingly, the present invention provides partitioning of a single large configuration memory on an FPGA into several smaller memory units. In this case, a large memory for programming an array of user logic cells, where each logic cell has a program memory area, for example 8 bits high by 3 words wide, is broken down into a 4×4 array of smaller 16×16 unit subarrays, each subarray corresponding to configuration memory for a 16×16 array of logic cells. Partitioning the memory in this way increases area of the layout of the chip, because multiple sets of memory access logic are required, one for each subarray. Also there is area overhead in routing address and data signals to the individual subarrays. However, smaller memories are likely to be faster and more flexible than a larger memory, and may be operated independently. This greatly increases the flexibility of the FPGA device for implementing small areas of user memory adjacent to the logic which uses the memory.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

I claim:

1. A programmable logic device, comprising:

a plurality of input/output cells;

a configurable logic array of configurable logic cells and interconnect structures;

a memory array of memory elements coupled with the configurable logic array such that memory elements in the memory array store data to program the configurable logic array, said memory array including a subarray of addressable memory elements coupled with a corresponding subarray of the configurable logic array;

memory access logic coupled with the memory array and the plurality of input/output cells, the memory access logic including address decode logic configurable to receive address signals from the plurality of input/ output cells and memory data path logic configurable to receive data signals from and supply data signals to the plurality of input/output cells;

a subarray decoder coupled to the configurable logic array, the subarray decoder coupled to said subarray of the memory array and decoding address signals from the interconnect structures of the configurable logic array to address memory elements in said subarray; and a subarray I/O path coupled to the configurable logic array, the subarray I/O path coupled to said subarray of the memory array and providing input and output data signals between the interconnect structures of the configurable logic array and addressed memory elements in said subarray.

2. The programmable logic device of claim 1, wherein the memory array includes a second subarray of addressable memory elements, and including a second subarray decoder coupled to the configurable logic array, the second subarray decoder coupled to said second subarray of the memory array and decoding address signals from the interconnect structures of the configurable logic array to address memory elements in said second subarray; and a second subarray I/O path coupled to the interconnect structure of the configurable logic array, the second subarray I/O path coupled to said second subarray of the memory array and providing input and output data signals between the interconnect structures of the configurable logic array and addressed memory elements in said second subarray.

3. The programmable logic device of claim 1, including:

a programmable interconnect circuit connected to the configurable logic array and to said subarray of the memory array, the programmable interconnect circuit including inputs connected to the configurable logic array, and inputs connected to the data I/O path for said subarray of the memory array, and including outputs connected to the configurable logic array, outputs connected to said data I/O path for said subarray of the memory array, and outputs connected to the subarray decoder for said subarray of the memory array.

4. The programmable logic device of claim 1, wherein the configurable logic cells comprise programmable elements configurable in response to data in the memory array to provide a storage element and a logic function.

5. The programmable logic device of claim 1, wherein the memory array comprises an array of static random access memory cells.

6. The programmable logic device of claim 1, wherein the subarray of the configurable logic array to which said subarray of the memory array corresponds, includes 256 or fewer configurable logic cells.

7. A programmable logic device, comprising:
- a plurality of input/output cells;
- a configurable logic array of configurable logic cells and interconnect structures;
- a memory array of memory elements, coupled with the configurable logic array, such that memory elements in the memory array store data to program the configurable logic array, said memory array including a set, having more than one member, of subarrays of addressable memory elements, members of said set coupled with corresponding subarrays of the configurable logic array;
- memory access logic coupled with the memory array and the plurality of input/output cells, the memory access logic including address decode logic configurable to receive address signals from the plurality of input/output cells, and memory data path logic configurable to receive data signals from and supply data signals to the plurality of input/output cells;
- a plurality of subarray decoders and corresponding configurable interconnect circuits coupled to the configurable logic array, the subarray decoders programmably connectable by the corresponding configurable interconnect circuits to corresponding subarrays in said set of subarrays and decoding address signals from the interconnect structures of the configurable logic array to address memory elements in corresponding subarrays; and
- a plurality of subarray I/O path circuits and corresponding configurable interconnect circuits coupled to the configurable logic array, the subarray I/O path circuits programmably connectable by the corresponding configurable interconnect circuits to corresponding subarrays of said set of subarrays and providing input and output data signals between the interconnect structures of the configurable logic array and addressed memory elements in corresponding subarrays.

8. The programmable logic device of claim 7, wherein the configurable interconnect circuits having corresponding subarray decoders include:
- a programmable switch connected to the configurable logic array and to said corresponding subarray decoder, the programmable switch including inputs connected to the configurable logic array, and including outputs connected to the configurable logic array, and outputs connected to the subarray decoder for said subarray of the memory array.

9. The programmable logic device of claim 7, wherein the configurable interconnect circuits having corresponding subarray I/O path circuits, include:
- a programmable switch connected to the configurable logic array and to said corresponding subarray decoder, the programmable switch including inputs connected to the logic cell array, and inputs connected to the data I/O path for said subarray of the memory array, and including outputs connected to the logic cell array, and outputs connected to said subarray I/O path circuit for said subarray of the memory array.

10. The programmable logic device of claim 7, wherein the configurable logic cells comprise programmable elements configurable in response to data in the memory array to provide a storage element and a logic function.

11. The programmable logic device of claim 7, wherein the memory array comprises an array of static random access memory cells.

12. The programmable logic device of claim 7, wherein the subarrays of the configurable logic array to which members of said set of subarrays correspond, include respectively 256 or fewer configurable logic cells, and said set of subarrays includes 4 or more members.

13. The programmable logic device of claim 7, wherein said set of subarrays includes 16 or more members.

14. A programmable logic device, comprising:
- a plurality of input/output cells;
- a configurable logic array of configurable logic cells and interconnect structures coupled with the plurality of input/output cells;
- a configuration memory, coupled with the configuration logic array and the plurality of input/output cells, such that the configuration memory stores data to program the configurable logic array, said configuration memory including a set, having more than one member, of subarrays of addressable static random access memory (SRAM) elements, members of said set coupled with corresponding subarrays of the configurable logic array and defining logic functions of corresponding subarrays of the configurable logic array;
- global memory access logic coupled with the configuration memory and the plurality of input/output cells, the memory access logic including address decode logic configurable to receive address signals from the plurality of input/output cells and in response select addressed SRAM elements in the configuration memory, and memory data path logic configurable to receive data signals from the plurality of input/output cells and the configurable logic array for writing to addressed SRAM elements, and configurable to supply data signals read from addressed SRAM elements to the plurality of input/output cells and the configurable logic array;
- a plurality of subarray decoders with corresponding configurable interconnect circuits coupled to the configurable logic array, the subarray decoders programmably connectable under control of the configuration memory by the corresponding configurable interconnect circuits to corresponding subarrays in said set of subarrays and decoding address signals from the interconnect structures of the configurable logic array to address SRAM elements in corresponding subarrays;
- a plurality of subarray I/O path circuits and corresponding configurable interconnect circuits coupled to the configurable logic array, the subarray I/O path circuits programmably connectable by the corresponding configurable interconnect circuits to corresponding subarrays of said set of subarrays and providing input and output data signals between the interconnect structures of the configurable logic array and addressed SRAM elements in corresponding subarrays;
- wherein the configurable interconnect circuits having corresponding subarray decoders include a programmable switch including inputs connected to the configurable logic array, and including outputs connected to the configurable logic array, and outputs connected to the subarray decoder for the corresponding subarray of the configuration memory; and
- wherein the configurable interconnect circuits having corresponding subarray I/O path circuits include a programmable switch including inputs connected to the logic cell array and inputs connected to the data I/O path for the corresponding subarray of the configurable memory, and including outputs connected to the logic cell array and outputs connected to said subarray I/O path circuit for the corresponding subarray of the configurable memory.

15. The programmable logic device of claim 14, wherein the subarrays of the configurable logic array to which members of said set of subarrays correspond, include respectively 256 or fewer configurable logic cells, and said set of subarrays includes 4 or more members.

16. The programmable logic device of claim 14, wherein said set of subarrays includes 16 or more members.

17. The programmable logic device of claim 14, wherein the configurable logic cells comprise programmable elements configurable in response to data in the configuration memory to provide a storage element and a logic function.

* * * * *